United States Patent [19]

Sata

[11] Patent Number: 5,666,052
[45] Date of Patent: Sep. 9, 1997

[54] MAGNETIC SENSOR HAVING A SUPERCONDUCTING QUANTUM INTERFERENCE DEVICE AND A PICKUP COIL WOUND ON A TUBULAR RESINOUS BOBBIN WITH EMBEDDED HIGH THERMAL CONDUCTIVITY MATERIAL

[75] Inventor: Kenichi Sata, Ibaragi, Japan

[73] Assignee: Daikin Industries, Ltd., Osaka, Japan

[21] Appl. No.: 290,765

[22] PCT Filed: Aug. 2, 1993

[86] PCT No.: PCT/JP93/01081

§ 371 Date: Aug. 17, 1994

§ 102(e) Date: Aug. 17, 1994

[87] PCT Pub. No.: WO95/04287

PCT Pub. Date: Feb. 9, 1995

[30] Foreign Application Priority Data

Mar. 6, 1992 [JP] Japan .......... 4-49397

[51] Int. Cl.$^6$ .......... G01R 33/035; H01L 39/22; H01F 5/02
[52] U.S. Cl. .......... 324/248; 505/846
[58] Field of Search .......... 324/248; 336/DIG. 1; 505/845, 846, 880

[56] References Cited

U.S. PATENT DOCUMENTS 4,693,000  9/1987  Hoenig .......... 324/248
5,349,291  9/1994  Kotani et al. .

FOREIGN PATENT DOCUMENTS 59-127563   7/1984  Japan .
59-182512  10/1984  Japan .
2302680    12/1990  Japan .
2302681    12/1990  Japan .
2302682    12/1990  Japan .
8807835    10/1988  WIPO .

OTHER PUBLICATIONS

Mulder, G. B. J. et al., "The application of heat drains in superconducting solenoids for AC purposes", Abstract, Proceedings of the Eleventh International Cryogenic Engineering Conference, ICEC 11, Berlin, West Gernamy, 22-25 Apr. 1986, ISBN 0-408-01258-7, 1986, Guildford, UK, Butterworths, UK.

Pennell, G. F. and Varmha, R., "Plastic Bobbin with Metal Heat Sink", IBM Technical Disclosure Bulletin, vol. 24, No. 7A, Dec. 1981, New York, US, p. 3347.

Primary Examiner—Walter E. Snow
Attorney, Agent, or Firm—Sixbey, Friedman, Leedom & Ferguson; Gerald J. Ferguson, Jr.; Bradley D. Blanche

[57] ABSTRACT

In case of cooling a SQUID magnetometer by a cryogenic refrigerator, a tubular resinous bobbin of the SQUID magnetometer around which a pick-up coil is wound is arranged so as to have wires, in the body of the bobbin, which are each coated with a resinous film, made of non-magnetic material with high thermal conductivity such as copper, and netted in a grid pattern substantially in an axial direction of the bobbin and a circumferential direction of the bobbin. According to the arrangement, thermal conduction characteristic of the bobbin is improved, thereby enhancing efficiency of cooling the pick-up coil made of a superconducting wire. This accomplishes an effective cooling of the SQUID magnetometer by the refrigerator.

9 Claims, 13 Drawing Sheets

1

MAGNETIC SENSOR HAVING A SUPERCONDUCTING QUANTUM INTERFERENCE DEVICE AND A PICKUP COIL WOUND ON A TUBULAR RESINOUS BOBBIN WITH EMBEDDED HIGH THERMAL CONDUCTIVITY MATERIAL

TECHNICAL FIELD

This invention relates to a magnetic sensor having a superconducting quantum interference device (SQUID) which is in the superconducting state on a level of cryogenic temperature, and relates to a magnetic detecting device in which the magnetic sensor is combined with a cryogenic refrigerator. In particular, this invention pertains to thermal conduction structure of a superconducting pick-up coil in a magnetic-flux input circuit which is connected to the SQUID.

BACKGROUND ART

Conventionally, there is known, as one of superconducting devices, a SQUID using Josephson effect. By connecting the SQUID to a magnetic-flux input circuit having a superconducting pick-up coil, there can be obtained a SQUID magnetometer as a kind of magnetic sensor for measuring an extremely faint magnetic field, i.e., a magnetic field generated from faint current in a living body such as a magnetocardiogram, a magnetic field generated from a microscopic magnetic substance in a living body.

When the SQUID magnetometer is cooled to a level of cryogenic temperature, that is, to a temperature level on which the SQUID and the superconducting coil turn to the superconducting state, there may be applied a method of cooling the SQUID magnetometer in such a manner that liquid helium on the level of cryogenic temperature is stored in a cryogenic container (cryostat) and the SQUID magnetometer is steeped in the liquid helium so as to be cooled. In this case, generally, a cooling head of a refrigerator for generating cool condition is entered in the cryogenic container and helium gas evaporated in the container is recondensed into liquid by the refrigerator.

In the above method, since the SQUID magnetometer is steeped in liquid helium, the SQUID magnetometer can be cooled at a short time.

On the other hand, since the cooling of the SQUID magnetometer is carried out by the medium of the liquid helium in the cryogenic container, its cooling system becomes large-sized and its operational performance is deteriorated. In addition, it requires much skill to treat the liquid helium and, depending on circumstances, a careless treatment of the liquid helium may cause a trouble.

Further, since the container in which the liquid helium is stored is not filled to the uppermost end thereof with the liquid helium, the temperature at the inside of the container increases toward the upper part of the container. As a result, a thermal gradient occurs at the inside of the container. This thermal gradient disadvantageously limits an angle capable of inclination of the container. Due to this disadvantage, when a biomagnetic field is measured, it becomes difficult to optionally set the SQUID, the pick-up coil and such in accordance with the condition (posture) of a subject. This is a problem which cannot be disregard.

Therefore, attention has been paid to a conventional method of contacting the SQUID magnetometer with the cooling head of the refrigerator in order that heat can be directly transmitted thereby cooling the SQUID magnetometer (for example, refer to the Japanese Patent Application Laid Open Gazette No. 2-302680).

In this case, the SQUID magnetometer, the pick-up coil and such are attached and thermally connected to a final cooling stage to be cooled below a transition temperature of superconductivity by the cryogenic refrigerator. Accordingly, if only the operation of the cryogenic refrigerator is controlled, selection makes possible between the superconducting state and the normal conducting state. This does not require to move the SQUID, the pick-up coil and such for the above selection.

On the other hand, when the SQUID magnetometer is cooled by the refrigerator in the above way, there is generated the following two problems. The pick-up coil of the magnetic-flux input circuit is generally wound into loops around a tubular bobbin made of resin. However, since the thermal conductivity of the resin forming the bobbin is low, it is very difficult to cool the pick-up coil around the bobbin to its transition temperature of superconductivity when the SQUID magnetometer is directly cooled by the refrigerator as above-mentioned.

It may be possible to form the bobbin by metal such as copper and aluminium with high thermal conductivity even in a range of cryogenic temperature. In this case, however, a normal conducting current loop generates at the bobbin in close vicinity to the magnetic-flux input circuit. As a result, mutual inductance generates between the current loop and the pick-up coil. This invites another problem that output-to-input characteristic of the SQUID magnetometer varies with frequency.

A second problem is described next. There may be another structure in which the SQUID is connected to the cryogenic refrigerator so as to be thermally conductable. For example, in the structure, a superconducting shield member containing the SQUID is placed on the center of the top surface of a stage which is cooled below the transition temperature of superconductivity (for example, a 4 K stage cooled to about 4 K) by the cryogenic refrigerator, a thermally-conductive block member is arranged in such a manner as to interpose and cross over the superconducting shield member, and a bobbin around which a pick-up coil is wound is stood on the center of the top surface of the thermally-conductive block. In this case, since the superconducting shield member is cooled below the transition temperature of superconductivity by the 4 K stage, this prevents the SQUID located inside the shield member from being affected by the outer magnetic field. At set positions on the superconducting shield member, holes are formed for being inserted by an electric wire which connects between the SQUID and the pick-up coil and an electric wire which connects between the SQUID and an electronic circuit arranged on a room temperature's side.

In the above structure, however, it is required to dispose the thermally-conductive block member in such a manner as to cross over the superconducting shield member. Therefore, the plane form of the SQUID magnetometer can be little lessened and it is difficult to make the SQUID magnetometer multi-channelized for high-precise measurement of a biomagnetic field.

Description is made in detail about the above problem. When the SQUID magnetometer is lessened in size, the superconducting shield member, the thermally-conductive block and the bobbin may be lessened in size. However, the bobbin cannot be minimized because its sensitivity of detecting magnetic flux is lowered when the bobbin is lessened in diameter. Further, because the necessary size of the superconducting shield member is determined by the size of the SQUID to be contained therein, the superconducting shield member is limited in its minimization. Consequently, the thermally conductive block arranged in such a manner as to cross over the superconducting shield member is limited in its minimization.

Furthermore, in view of an actual process of producing the SQUID magnetometer, the pick-up coil is wound around the bobbin so as to form first-order or second-order differential type coil. This requires the following producing steps. From this, minimization of the SQUID magnetometer is also limited. The producing steps are as follows: The pick-up coil is wound in such a manner as to be provided together with the thermally-conductive block and the bobbin; a lead wire from the pick-up coil is conducted to the SQUID with the pick-up coil thermally-connected to the bobbin and the thermally-conductive block; and then the lead wire is electrically connected to the SQUID by superconductive soldering or the like. Accordingly, it is required that an inner space of the thermally-conductive block has an area allowing the above work of electrical connection, in detail, an area allowing insertion of a soldering iron and fingers. Since the size of the inner space of the thermally-conductive block is limited as mentioned above, the SQUID magnetometer can be little lessened in its form projected on the plane. Since it is a matter of course that a complicated producing process for the SQUID magnetometer is required, it costs long time to assemble the SQUID magnetometer. As for this point, even in case of the above electric connection between the SQUID and the pick-up coil, the above-mentioned complicated process is required. On the other hand, in case of electrical connection between the SQUID and the electronic circuits on the room temperature's side, a thermal anchor is required for thermal connection of the lead wire to the 4 K stage, and the lead wire requires to be wired to some proper positions and then to be conducted on the room temperature's side. This leads to extremely complicated work as a whole. In addition, depending on the relative positions between the plural SQUID magnetometers, the position for the thermal anchor cannot be ensured.

If the 4 K stage is increased in size, the SQUID magnetometer is relatively lessened in size. However, since the 4 K stage is cooled in a way of thermal conduction by the cryogenic refrigerator, the 4 K stage cannot be increased in size above the cooling capability of the cryogenic refrigerator. This also prevents the SQUID magnetometer from being multi-channelized.

Further, even if the multi-channelization of the SQUID magnetometer is accomplished, there cannot be checked and repaired the SQUID magnetometer which is surrounded by other SQUID magnetometers and has trouble, except after the other SQUID magnetometers are taken apart and removed. This extreme lowers operating performance in maintenance, check and repair of the SQUID magnetometer.

Furthermore, since the thermally-conductive block is generally so composed that plural blocks are fixed in order by screws or the like, the heat resistance of the thermally-conductive block is different between portions thereof depending on the contacting state between the plural blocks. This may make the temperature of the pick-up coil different between one SQUID magnetometer and another SQUID magnetometer, and, in the worst case, a pick-up coil of at least one SQUID magnetometer cannot be cooled below the transition temperature of superconductivity.

In view of the foregoing problems, this invention has been made. A first object of this invention is to improve the structure of a bobbin around which a pick-up coil is wound in a SQUID magnetometer, that is, to enhance the cooling efficiency of the SQUID magnetometer to the pick-up coil without affecting input/output characteristic of the SQUID magnetometer, thereby effectively carrying out the cooling of the SQUID magnetometer by a refrigerator.

A second object of this invention is to readily multi-channelize the SQUID magnetometer which is cooled in a way of thermal conduction by a cryogenic refrigerator, to simplify an assembling work of the SQUID magnetometer, and to extremely enhance the operation performance in maintenance, check and repair of the SQUID magnetometer.

DISCLOSURE OF INVENTION

To attain the first object, in this invention, wires each coated with a resinous film and made of non-magnetic material with high thermal conductivity, such as copper, aluminium, are arranged in a body of a resinous bobbin.

In detail, this invention premises a magnetic sensor having a SQUID which is in the superconducting state on a level of cryogenic temperature and having a magnetic-flux input circuit which is connected to the SQUID. The magnetic-flux input circuit comprises: a pick-up coil wound around a tubular resinous bobbin; and plural wires each coated with a resinous film and made of non-magnetic material with high thermal conductivity, such as copper, and aluminium, the plural wires being arranged in the body of the resinous bobbin and netted in a grid pattern so as to extend substantially in an axial direction of the bobbin and a circumferential direction of the bobbin.

According to the above construction, since the plural wires each coated with a resinous film and made of non-magnetic material with high thermal conductivity, such as copper, are arranged in the body of the resinous bobbin and netted in a grid pattern, the thermal-conduction characteristic of the bobbin is improved with respect to the direction of the center axis of the bobbin and the circumferential direction thereof, that is, with respect to the entire bobbin. Accordingly, when the magnetic sensor is cooled by a cryogenic refrigerator, a thermally-conductable connection of the bobbin to a cooling stage of the refrigerator results in smooth thermal conduction between the cooling stage and the bobbin, thereby readily cooling the bobbin. This enables the pick-up coil wound around the bobbin to be cooled to the transition temperature of superconductivity at a short time.

Further, since each of the wires as components of the bobbin is coated with a resinous film, even if the wires are made of metal such as copper and aluminium, the wires do not contact directly one another though they intersect one another. In addition, it is avoided that ends of the wires extending substantially in the circumferential direction of the bobbin contact one another. Accordingly, a loop of normal conducting current generates only at an inner section of each wire and is extremely little. As a result, variation of input/output characteristic of the magnetic sensor due to the loop of normal conducting current can be restricted.

In the above magnetic sensor, the wires extending substantially in the axial direction of the bobbin may be larger in diameter than the wires extending substantially in the circumferential direction of the bobbin. Under this structure, the thermal-conduction characteristic of the bobbin is enhanced with respect to the axial direction thereof. Accordingly, even if the end of the bobbin is connected to the cooling stage of the refrigerator so as to be thermally conductable, cooling to the bobbin by the cooling stage is smoothly conducted, thereby cooling the bobbin and the pick-up coil wounded therearound to the transition temperature of superconductivity at a short time.

Furthermore, in a magnetic sensor as in the first-premised magnetic sensor of this invention, plural wires each coated with a resinous film and made of non-magnetic material with high thermal conductivity, such as copper, aluminium, and plural wires each made of non-conductive material, such as glass fiber, may be arranged at the internal part of a tubular resinous bobbin around which a pick-up coil of the magnetic-flux input circuit is wound, and netted in a grid pattern in such a manner that the wires made of non-magnetic material with high thermal conductivity extend substantially in an axial direction of the bobbin.

As mentioned above, out of the wires as components of the bobbin, only the wires substantially in the axial direction of the bobbin are each coated with a resinous film and made of non-magnetic material with high thermal conductivity, such as copper, aluminium, while the wires substantially in the circumferential direction of the bobbin are made of non-conductive material such as glass fiber. Accordingly, the thermal-conduction characteristic of the bobbin is enhanced with respect to the axial direction of the bobbin, thereby cooling the bobbin and the pick-up coil to the transition temperature of superconductivity at a short time through the cooling stage of the refrigerator. In addition, there can be further ensured to restrict generation of the current loop in the bobbin in the circumferential direction thereof. This performs more effectively the restriction of variation of the input/output characteristic in the magnetic sensor.

Moreover, in a magnetic sensor as in the first-premised magnetic sensor, a tubular bobbin around which a pick-up coil of the magnetic-flux input circuit is wound may have a resinous body and plural wires which are made of non-magnetic material with high thermal conductivity, such as copper, aluminium, and which are embedded in the resinous body with set spaces left respectively in a circumferential direction of the bobbin so as to extend substantially in an axial direction of the bobbin. According to such a construction, there can be obtained the same as operations and effects in the first-mentioned magnetic sensor.

Further, in a magnetic sensor as in the first-premised magnetic sensor, the tubular bobbin may have a wall part made of three layers formed of: a high thermally-conductive resin layer which is mixed with non-magnetic material with high thermal conductivity such as copper, aluminium; and two fiber reinforced resin layers which are respectively arranged inside and outside the high thermally-conductive resin layer and which are made of non-conductive material such as glass fiber. According to this construction, the high thermally-conductive resin layer is disposed in the middle of the bobbin in a thickness direction thereof and the resin layer includes non-magnetic material with high thermal conductivity. This enhances the thermal-conduction characteristic of the bobbin with respect to the axial direction of the bobbin, thereby cooling the bobbin and the pick-up coil to the transition temperature of superconductivity at a short time through the cooling stage of the refrigerator. In addition, it can be further ensured to restrict generation of the current loop at the bobbin substantially in the circumferential direction thereof. This performs more effectively the restriction of variation of the input/output characteristic in the magnetic sensor.

There may be provided magnetic detecting devices in which each of the above-mentioned magnetic sensors is combined with a cryogenic refrigerator for cooling a cold receiving member to a level of cryogenic temperature and the resinous bobbin of the magnetic sensor is connected to the cold receiving member so as to be thermally conductive.

Further, to attain the second object of this invention, each of the magnetic sensors of the above magnetic detecting devices composes a high thermally-conductive member an end of which is connected to the bobbin and another end of which is removably attached to a set position of a cold receiving member to be cooled on a level of cryogenic temperature by the cryogenic refrigerator, and a superconducting shield member which is removably attached to a set position of the side of the high thermally-conductive member and contains a SQUID at the attached state.

According to this construction, if only the high thermally-conductive member connected to the bobbin around which the pick-up coil is wound is attached to the cold receiving member, the magnetic sensor can be readily disposed. Since it is a matter of fact that the superconducting shield member containing the SQUID is attached removably to the set position of the side of the high thermally-conductive member, this has very little influence on the disposition of the magnetic sensor. In addition, the electric connection between the SQUID and the pick-up coil can be accomplished before the high thermally-conductive member is attached to the cold receiving member. This dispenses with wiring and soldering at a narrow space. Accordingly, there can be simplified assembly, maintenance, check and repair of the magnetic sensor.

Further, since the superconducting shield member is attached to the set position of the side of the high thermally-conductive member, this extremely lessens the projective form on the plane of the magnetic sensor as compared with the structure in which the high thermally-conductive member crosses over the superconducting shield member. Accordingly, the magnetic sensor can be readily multi-channelized without increasing the cold receiving member in size. In addition, without enlarging a required plane form of the magnetic sensor for preventing interference with other magnetic sensors resulting from the attachment, plural SQUIDs and its corresponding superconducting shield members are attached, thereby enhancing utilization efficiency of space. In other words, the multi-channelization of the magnetic sensor can be readily accomplished at a relatively narrow area. For example, if there are provided around the bobbin two pairs of pick-up coils of first-order differential type, an equivalent to that of second-order differential type which has perfect balance can be obtained, and only objective signals in which noise influence is removed with high precision can be obtained with high precision by using two pick-up coils for signal detection and for reference at noise reduction respectively. Furthermore, since the high thermally-conductive member can be previously formed as a single unit, the pick-up coil can be securely cooled below the transition temperature of superconductivity.

In the magnetic detecting device having the above construction, the high thermally-conductive member may have a concavity at the set position of the side thereof and the superconducting shield member may be attached to the concavity. Thus, since there is applied the high thermally-conductive member having the concavity at the set position of the side and the superconducting shield member is attached to the concavity, the required projective form on the plane of the magnetic sensor for preventing interference with other magnetic sensors resulting from the attachment can be lessened, thereby further enhancing utilization efficiency of space. In other words, the number of magnetic sensors attachable to a relatively narrow area is further increased.

Further, in the magnetic detecting device, the high thermally-conductive member may have, at an end thereof which is removably attached to the set position of the cold receiving member, a through hole for being inserted by a wire toward a room temperature's side. Thus, since the high thermally-conductive member has, at its end which is removably attached to the set position of the cold receiving member, a through hole for being inserted by a wire toward the room temperature's side, the wire toward the room temperature's side is connected to the SQUID before the magnetic sensor is attached to the cold receiving member. Accordingly, after the attachment of the magnetic sensor to the cold receiving member, the wire can be arranged only on a back side of the cold receiving member without arranging the wire on a front side thereof. This simplifies wire arrangement.

BEST MODE FOR CARRYING OUT THE INVENTION

Best modes for carrying out this invention are described as examples with reference to the drawings.

Figure 3:
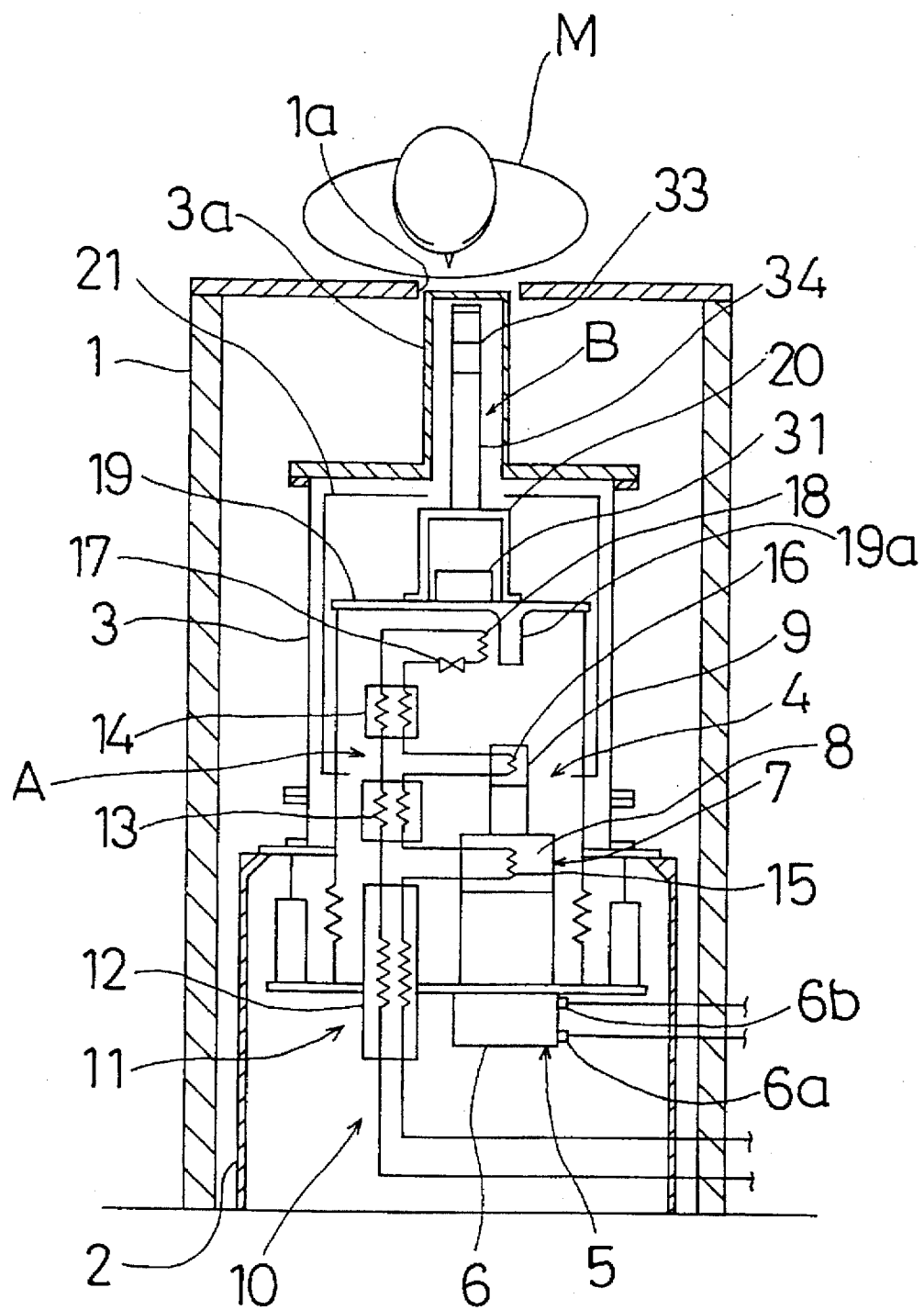
FIG. 3 is a schematic section of the cryogenic refrigerator and a SQUID magnetometer in the example 1.

FIG.3 is a total structure of an example 1 of this invention. In this example, a SQUID magnetometer as a magnetic sensor is used for measuring magnetic waves from a human heart. In the figure, (1) indicates a stand for laying thereon a subject (M) whose magnetic waves from the human heart are measured and the stand (1) is disposed in a electromagnetic shield room or a magnetic shield room. Below the stand (1), a tubular supporting stand (2) is disposed. On the tubular supporting stand (2), a sealed vacuum chamber (3) is fixedly supported by the supporting stand (2) in such a manner that the bottom end thereof is sunk in the supporting stand (2). An inner space of the vacuum chamber (3) is maintained in a vacuous condition. At the top end of the inner space, a SQUID magnetometer (B) as a magnetic sensor is contained. (A) indicates a helium refrigerator having a binary circuit for cooling the SQUID magnetometer (B) to a level of cryogenic temperature on which the SQUID magnetometer (B) is operable.

There are attached to the vacuum chamber (3) an expander (5) of a previously refrigerating circuit (4) forming a part of the refrigerator (A) and an expansion unit (11) of a J-T (Joule-Thomson) circuit (10). The precooling refrigerating circuit (4) is composed of a refrigerator of G-M (Gifford-McMahon) cycle for compressing and expanding helium has to precool helium gas in the J-T circuit (10), and is connected in a closed circuit with an un-shown compressor of the precooling refrigerating circuit and the expander (5). The expander (5) is attached to a bottom wall of the vacuum chamber (3) so as to insulate its vibration. The expander (5) has a casing (8) fixedly disposed at an under surface of the bottom wall of the vacuum chamber (3), and a cylinder (7) of a two-stage structure which is connected to an upper part of the casing (8). The casing (6) has a high-pressure gas inlet (6a) which is connected to a discharge side of the compressor of precooling refrigerating circuit, and a low-pressure gas outlet (6b) which is connected to an intake side of the compressor. The cylinder (7) passes through the bottom wall of the vacuum chamber (3) so as to make the bottom wall gastight and extends upward at the inside of the vacuum chamber (3). The cylinder (7) has a first heat station (8) which is formed at an upper end of a larger diameter part thereof and maintained on a temperature level of 55–60 K, and a second heat station (9) which is formed at an upper end of a smaller diameter part thereof and maintained on a temperature level of 15–20 K lower than that of the first heat station (8).

A displacer, which is un-shown in the figure, is inserted reciprocatably in the cylinder (7) so as to section an expansion chamber at corresponding positions to the heat stations (8), (9). Inserted in the casing (8) are a rotary valve which opens at respective rotations to change over a gas flow so as to supply helium gas flowing into the casing from the high-pressure gas inlet (6a) to the expansion chamber in the cylinder (7) or so as to discharge helium gas expanded in the expansion chamber from the low-pressure gas outlet (6b), and a valve motor for driving the rotary valve. High-pressure helium gas is expanded by Simon expansion in the expansion chamber of the cylinder (7) by the opening of the rotary valve of the expander (5). Then, the temperature fall resulting from the expansion generates cool condition on a level of cryogenic temperature. The cool condition is maintained at the first and second heat stations (8), (9) of the cylinder (7). Thus, the precooling refrigerating circuit (4) of closed circuit type is so arranged that: high-pressure helium gas discharged from the refrigerator for precooling is supplied to the expander (5); the temperature of the heat stations (8), (9) is lowered by adiabatic expansion in the expander (5) thereby precooling the below-mentioned precoolers (15), (16) of the J-T circuit (10); and then the expanded helium gas is returned to the compressor for re-compression.

The J-T circuit (10) is a refrigerating circuit for compressing helium gas thereby leading the helium gas to Joule-Thomson expansion in order to generate cool condition on a level of cryogenic temperature of about 4 K, and has a compressor (no-shown) for compressing helium gas and the expansion unit (11) for leading the compressed helium gas to Joule-Thomson expansion. The expansion unit (11) has a first J-T heat exchanger (12) which passes through the bottom wall of the vacuum chamber (3) so as to make the bottom wall gastight. The first J-T heat exchanger (12) is connected to second and third J-T heat exchangers (13), (14)

which are arranged inside the vacuum chamber (3). Each of the J-T heat exchangers (12)–(14) exchanges heat between helium gasses passing on its primary side and its secondary side. The primary side of the first J-T heat exchanger (12) is connected to the discharge side of the compressor of the J-T circuit. Both the primary sides of the first and second J-T heat exchangers (12), (13) are connected to each other via a first precooler (15) composed of a heat exchanger which is disposed around an outer periphery of the first heat station (8) of the expander (5). Similarly, both the primary sides of the second and third J-T heat exchangers (13), (14) are connected to each other via a secondary procooler (16) composed of a heat exchanger which is disposed around an outer periphery of the second heat station (9) of the expander (5). Further, the primary side of the third J-T heat exchanger (14) is connected to a cooler (18) via a J-T valve (17) for leading high-pressure helium gas to Joule-Thomson expansion. An opening of the J-T valve (17) is regulated by an operating rod (no-shown) from the outside of the vacuum chamber (3). The cooler (18) is formed of a coiled pipe wound around an outer periphery of a cool reception part (19a) located on a under surface of a disk-shaped cold receiving member (cold receiving plate) (19). According to this structure, the cold receiving member (19) contacts the cooler (18) so as to be thermally conductable, thereby maintaining about 4 K of the same temperature as in the cooler (18). Further, the SQUID magnetometer (B) is integrally mounted, so as to be thermally conductable, on a top surface of the cold receiving member (19).

The cooler (18) is connected to the secondary side of the first J-T heat exchanger (12) via respective secondary sides of the third and second J-T heat exchangers (14), (13). The secondary side of the first J-T heat exchanger (12) is connected to the intake side of the compressor of the J-T circuit (10). Thus, the J-T circuit (10) is so arranged that: helium gas is compressed into high pressure to be supplied toward the vacuum chamber (3); heat exchange is conducted, by the first to third J-T heat exchangers (12)–(14) in the vacuum chamber (3), between the high-pressure helium gas and low-temperature low-pressure helium gas which returns to the compressor; heat exchange is conducted, by the first and second precoolers (15), (16), between the high-pressure helium gas and the first and second heat stations (8), (9) of the expander (5); Joule-Thomson expansion is conducted to the high-pressure helium gas by the J-T valve (17) so that the helium gas is made into helium of a gas-liquid mixing state with 1 atm and about 4 K by the cooler (18); the cold receiving member (19) and the SQUID magnetometer (B) contacting it are cooled and held on a level of cryogenic temperature of about 4 K by latent heat of vaporization of the helium; and then the helium gas of low pressure due to the expansion is drawn into the compressor of the J-T circuit for re-compression via respective secondary sides of the first to third J-T heat exchangers (12)–(14).

Figure 1:
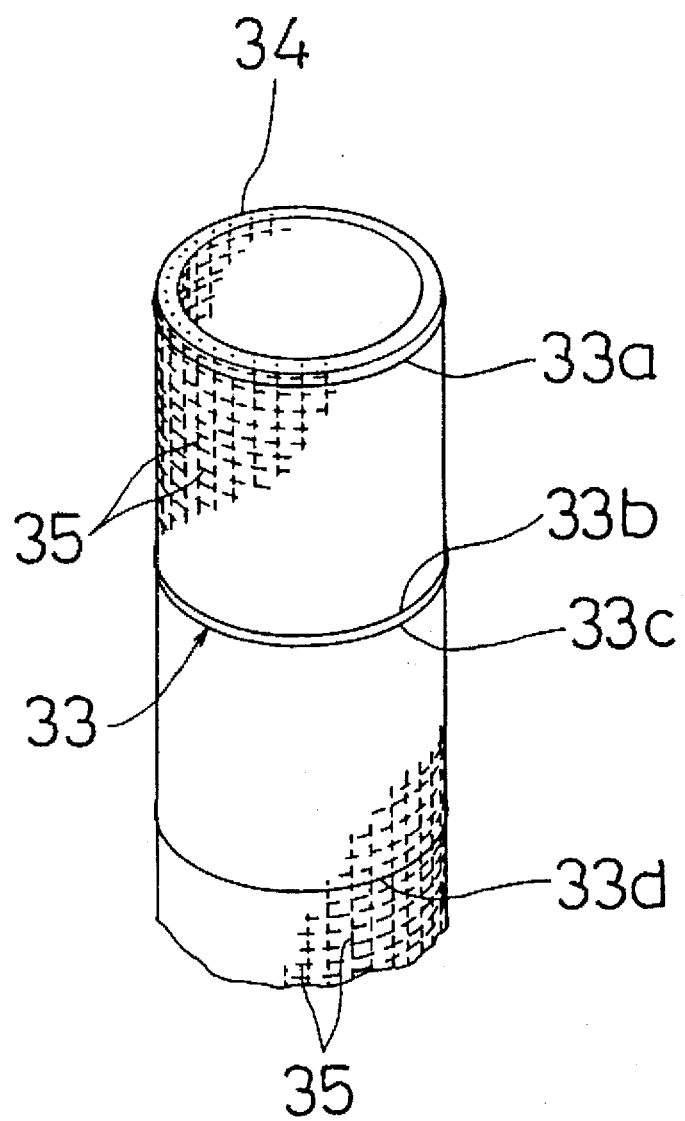
FIG. 1 is an enlarged perspective view of a main part of a bobbin in an example 1 of this invention.
Figure 2:
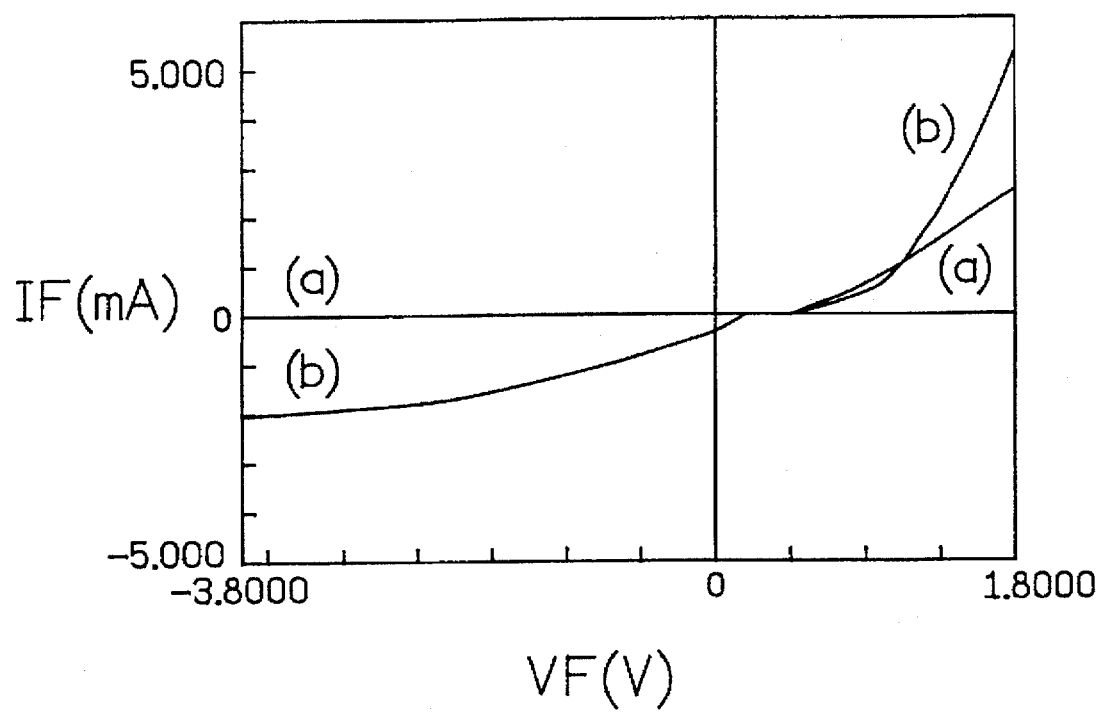
FIG. 2 is an enlarged section of a main part of a cryogenic refrigerator in the example 1.

As shown in FIG. 2, the SQUID magnetometer (B) has a SQUID (no-shown) which is in the superconducting state on a level of cryogenic temperature, and a magnetic-flux input circuit connected to the SQUID. The SQUID is fixed, so as to be thermally conductable, to the upper surface of the cold receiving member (19) in such a manner as to be contained in the superconducting shield member (31). As shown in FIG. 1, the magnetic-flux input circuit (32) has a pick-up coil (33) which is formed of a superconducting wire wound in loops to a tubular bobbin (34). The pick-up coil (33) has four loops and is a second-order differential type one that the four loops are connected in series with set spaces left respectively in order that the current of each of upper and lower loops (33a), (33d) flows in an opposite direction to the current of two middle loops (33b), (33c) in an alternative way. That is, the SQUID magnetometer (B) forms a gradiometer for measuring a second order gradient of the magnetic field by the pick-up coil which is wound into the four loops (33a)–(33d).

On the top surface of the cold receiving member (19), a thermally-conductive bracket (20) is attached over the superconducting shield member (31) for containing the SQUID. The bobbin (34) is disposed in such a manner as to stand on the top surface of the bracket (20). The bobbin (34) has a length of about 200–300 mm and extends upward in an upper swelling (3a) formed at a center of an upper wall of the vacuum chamber (3). The pick-up coil (33) is wound around an upper part of the bobbin (34) and cooled below the transition temperature of superconductivity thereof through the bobbin (34). The upper end of the swelling (3a) of the vacuum chamber (3) faces an opening (1a) at the center of the stand (1). Magnetic waves of a heart of a subject (M) on the top surface of the stand (1) is measured through the opening (1a).

This invention has a feature thereof in a structure of the bobbin (34) around which the pick-up coil (33) is wound. In detail, as shown in FIG. 1, plural wires (35), (35), . . . in which copper wires of about 0.5 mm diameter as non-magnetic material with high thermal conductivity are each coated with a resinous film are arranged at the internal part of the resinous bobbin (34) and netted in a grid pattern so as to extend substantially in an axial direction of the bobbin (34) and a circumferential direction of the bobbin (34). The copper wire may be substituted by an aluminium wire.

In FIGS. 2 and 3, (21) indicates a radiant-heat shield disposed at the upper part of the vacuum chamber (8) so as to cover the cold receiving member (19), the superconducting shield member (31) for containing the SQUID, the bracket (20), and the lower part of the bobbin (34). The radiant-heat shield contacts the first heat station (8) of the expander of the precooling refrigerating circuit (4) thereby maintaining its temperature at about 80 K. In FIG. 2, (22) indicates a super insulation disposed concentrically around the bobbin (34).

Next, operation of this example is described. In accordance with the operation of the helium refrigerator (A), the SQUID magnetometer (B) is cooled. When the SQUID magnetometer (B) decreases its temperature to the level of cryogenic temperature of about 4 K, the SQUID magnetometer starts operating.

In detail, when respective compressors in the precooling refrigerating circuit (4) and the J-T circuit (10) are first driven to make the helium refrigerator (A) a steady operation state, high-pressure helium has supplied from the compressor of the precooling refrigerating circuit is expanded by the expander (5) of the precooling refrigerating circuit (4). Because of temperature decrease due to the gas expansion, the first heat station (8) and the second heat station (9) of the cylinder (7) are cooled to respective temperature levels of 55–80 K and 15–20 K.

At the same time, in the J-T circuit (10), high-pressure helium gas discharged from the compressor is supplied toward the vacuum chamber (3). The high-pressure helium gas supplied toward the vacuum chamber (3) enters the primary side of the first J-T heat exchanger (12) and heat exchange is conducted therein between the high-pressure helium gas and low-pressure helium has of secondary side which returns to the compressor so that the high-pressure helium gas is cooled from its room temperature of 300 K to about 70 K. Then, the helium has enters the first precooler (15) located at the outer periphery of the first heat station (8) which is cooled at 55–80 K in the expander (5) thereby decreasing its temperature to about 55 K. The cooled gas enters the primary side of the second J-T heat exchanger (13) and heat exchange is conducted therein between the high-pressure helium gas and low-pressure helium gas of secondary side so that the high-pressure helium gas is cooled to about 20K. Then, the gas enters the second precooler (16) located at the outer periphery of the second heat station (9) which is cooled at 15–20 K in the expander (5) thereby decreasing its temperature to about 15 K. Next, the gas enters the primary side of the third J-T heat exchanger (14) and heat exchange is conducted therein between the high-pressure helium gas and low-pressure helium gas of secondary side so that the high-pressure helium gas is cooled to about 5 K. Then, the gas reaches to the J-T valve (17). In the J-T valve (17), the high-pressure helium gas is squeezed to make a Joule-Thomson expansion, thereby being helium of 1 atm and about 4 K in a gas-liquid mixing condition. Then, the helium is supplied to the cooler (18) located downstream the J-T valve (17). In the cooler (18), the cold receiving member (19) is cooled by latent heat of vaporization by liquid part of the helium in a gas-liquid mixing condition. When the cold receiving member (19) is cooled, there are cooled the SQUID of the SQUID magnetometer (B) contacting the cold receiving member (19) so as to be thermally conductable, a superconducting shield member (31) containing the SQUID magnetometer, the bobbin (34), and the pick-up coil (33) of the magnetic-flux input circuit (32).

Then, the evaporated low-pressure helium gas returns from the cooler (18) to the secondary side of the third J-T heat exchanger (14) and becomes saturated gas of about 4 K during the return. The helium gas passes respective secondary sides of the second and first J-T heat exchanger (13), (12) to cool the high-pressure helium gases of respective primary sides, and finally increases its temperature to about 300 K (room temperature). Successively, the gas returns to the intake side of the compressor. In the above manner, one cycle of the precooling refrigerating circuit (4) and the J-T circuit (10) completes. After this, refrigerating operation of the refrigerator (A) is carried out so as to repeat the above manner. By continuation of the above refrigerating operation, the temperature of the SQUID magnetometer (B) falls toward the level of cryogenic temperature (operation temperature level). When the temperature reaches to the level of cryogenic temperature, the SQUID magnetometer starts operating.

In this example, since the wires (35), (35), ... that the copper wires with high thermal conductivity are each coated with a resinous film are arranged longitudinally and laterally in the body of the resinous bobbin (34) around which the pick-up coil (33) made of the superconducting wire is wound, thermal-conduction characteristic of the bobbin (34) is enhanced with respect to an axial direction and a circumferential direction of the bobbin (34), as compared with the case where the entire bobbin is formed of only resinous material. Accordingly, the cooling from the cold receiving member (19) which is cooled on a 4 K level by the refrigerator (A) is smoothly conducted to the bobbin (34), thereby readily cooling the bobbin (34). The pick-up coil (33) wound around the bobbin (34) can be cooled to the level of cryogenic temperature at a short time.

Further, since the wires (35) arranged in the body of the resinous bobbin (34), which are copper wires, is each coated at the surface with the resinous film of insulation material, the wires (35) do not contact one another directly at the intersecting part and the circumferential end. As a result, the bobbin (34) does not generate, at a wide area, a normal conducting current loop, that is, the loop generates only at the inner of each wire (35) to be extremely small. Accordingly, it is prevented that the input/output characteristic of the SQUID magnetometer (B) varies due to the current loop.

Figure 4:
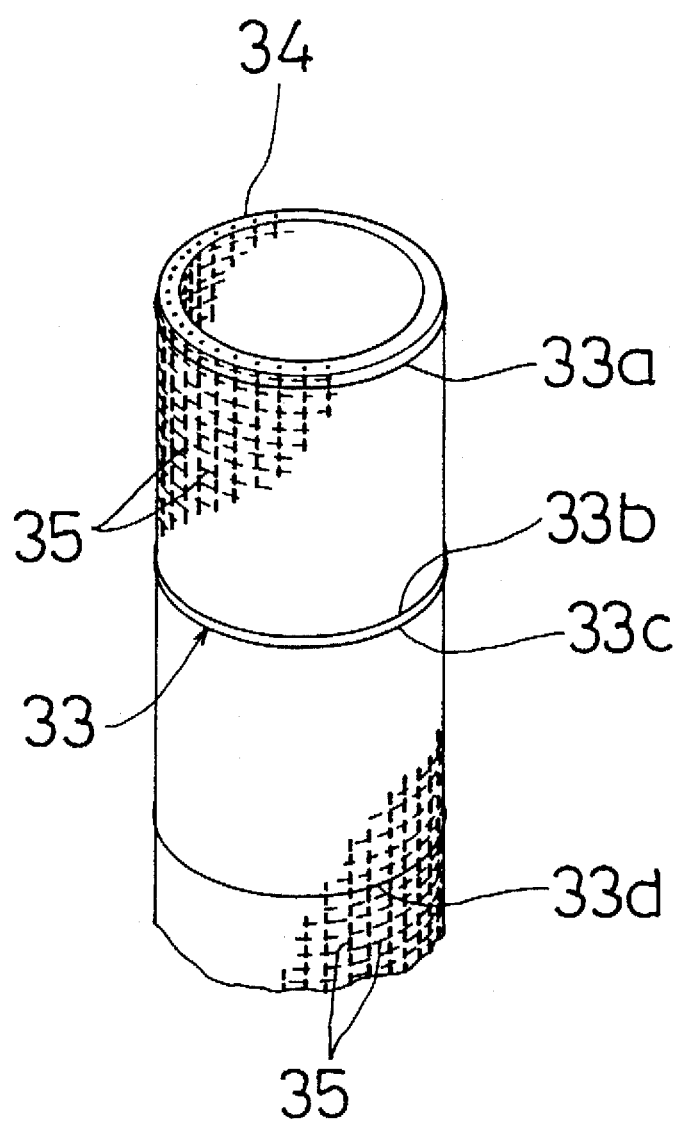
FIG. 4 is a corresponding diagram to FIG. 1 in an example 2 of this invention.

In the example 1, both the wires (35), (35) respectively arranged in the axial direction and the circumferential direction of the resinous bobbin (34) have same diameter as each other. As in an example 2 shown in FIG. 4, however, the wires (35) in the axial direction may be larger in diameter than the wires (35) in the circumferential direction. According to such a structure, thermal-conduction characteristic in the axial direction of the bobbin (34) further enhances as compared with that in the circumferential direction, and the cooling from the cold receiving member (19) is conducted smoothly by the bobbin (34), even if the bobbin (34) is so arranged that the lower end thereof contacts, so as to be thermally conductable, the cold receiving member (19) of the refrigerator (A) as in the above-mentioned construction. This enhances efficiency of cooling the bobbin (34) and the pick-up coil (33) wound around the bobbin (34).

Figure 5:
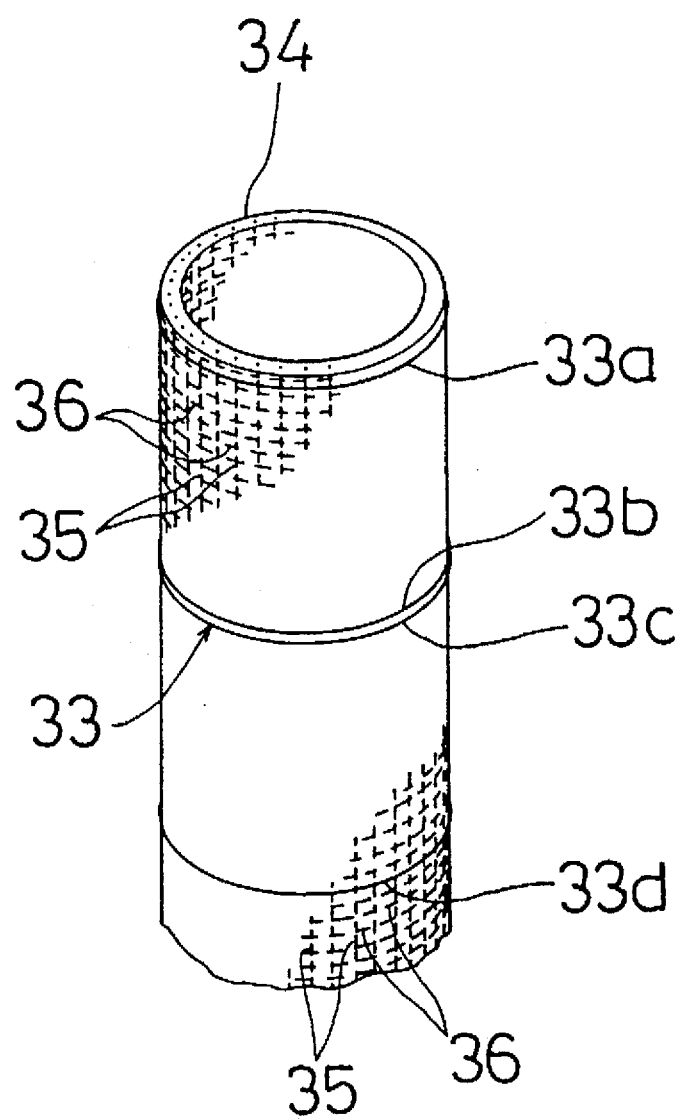
FIG. 5 is a corresponding diagram to FIG. 1 in an example 3 of this invention.

FIG. 5 shows an example 3 of this invention, wherein the wire in a circumferential direction in the body of the resinous bobbin (34) is changed in material. In detail, similar to the examples 1 and 2, wires are arranged in a body of a tubular resinous bobbin (34) around which a pick-up coil (33) of a magnetic-flux input circuit (32) is wound, and netted so as to form a grid pattern in an axial direction and a circumferential direction of the bobbin (34). In this construction, the wires (35) in the axial direction are each made of a copper wire (or an aluminium wire) coated with a resinous film while the wires (36) in the circumferential direction are made of non-conductive material such as glass fiber.

In this example, since the wires (35) in the axial direction arranged in the body of the bobbin (34) is each made of a copper wire or an aluminium wire which is coated with a resinous film, similar to the example 1, thermal-conduction characteristic of the bobbin (34) is enhanced with respect to the axial direction of the bobbin. Accordingly, the bobbin (34) and the pick-up coil (33) are cooled to the transition temperature of superconductivity at a short time by the cold receiving member (19) of the refrigerator (A). In addition to this, since the wires (36) in the circumferential direction arranged in the body of the bobbin (34) are made of non-conductive material such as glass fiber, it can be securely restrained that current loops in a circumferential direction of the bobbin (34) generate at the bobbin (34). This prevents further effectively variation of the input/output characteristic of the SQUID magnetometer (B).

Figure 6:
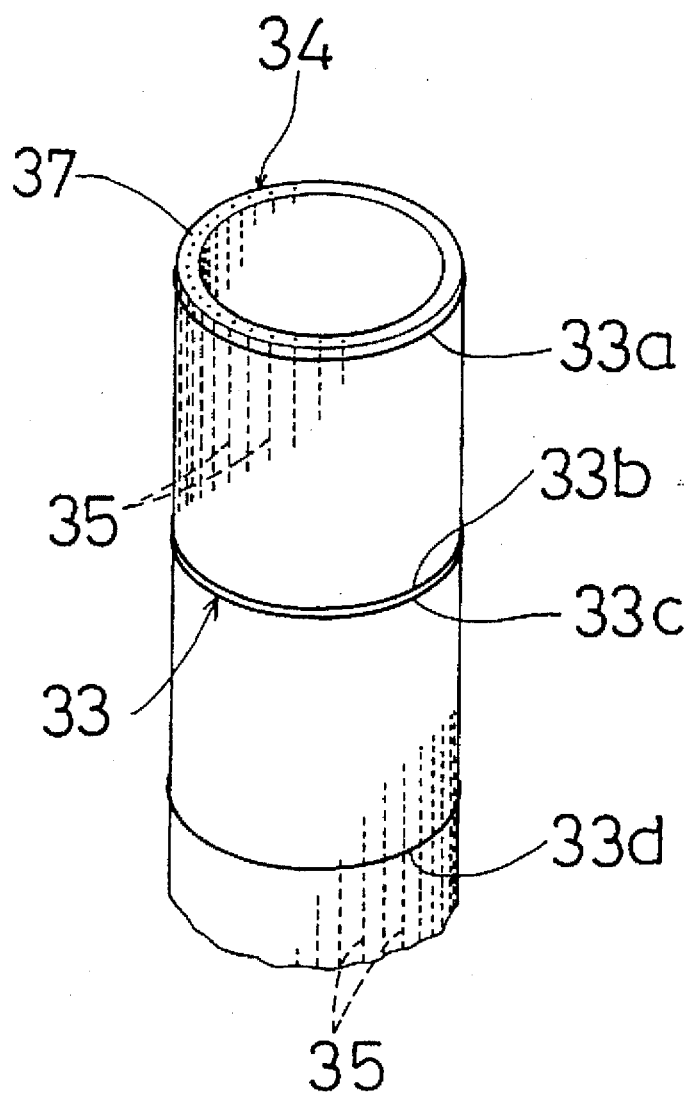
FIG. 6 is a corresponding diagram to FIG. 1 in an example 4 of this invention.

FIG. 6 shows an example 4 of this invention. A resinous bobbin (34) has a tubular resinous body (37). In the internal portion of the resinous body (37), plural wires (35), (35), . . . made of non-magnetic material with high thermal conductivity, such as copper, aluminum, are embedded with set spaces left respectively so as to extend in an axial direction of the bobbin (34).

In this example, the cooling from the cold receiving member (19) of the refrigerator (A) is conducted to the bobbin (34) in the axial direction thereof via the wires (35), . . . of the resinous body (37). This enhances thermal-conduction characteristic of the bobbin (34) with respect to the axial direction of the bobbin (34).

Further, since the wires (35), (35), . . . are arranged with set spaces left respectively in the circumferential direction of the bobbin (34), no current loop generates in the circumferential direction of the bobbin (34). This effectively prevents variation of the input/output characteristic of the SQUID magnetometer (B).

Figure 7:
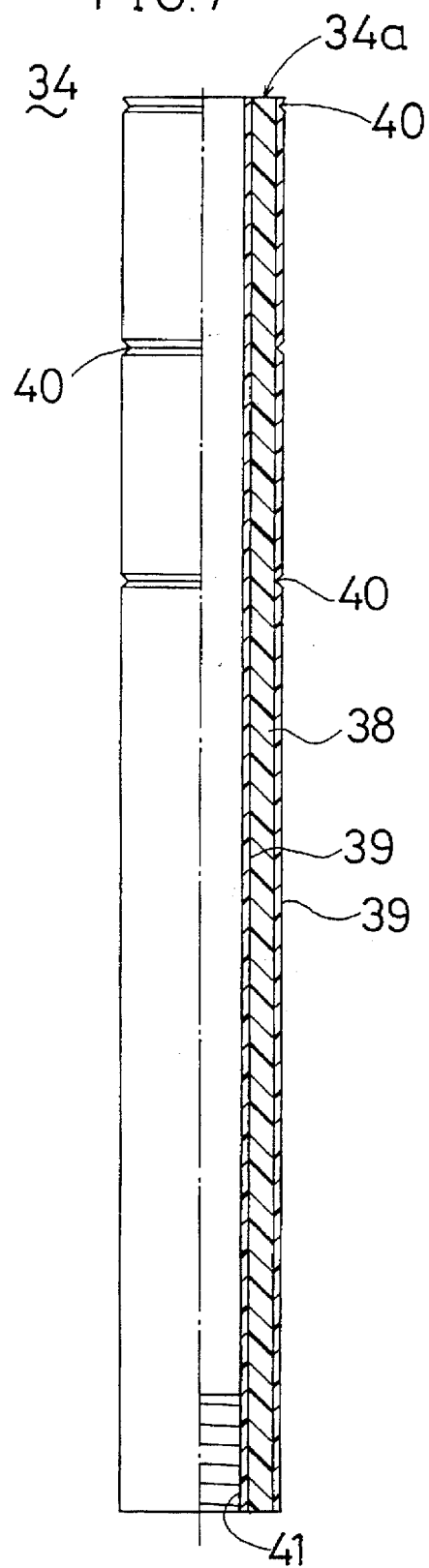
FIG. 7 is an elevation partly in section of a bobbin in an example 5 of this invention.

FIG. 7 shows an example 5 of this invention. In this example, a resinous bobbin (34) has a wall part (34a) made of three layers formed of: a high thermally-conductive resin layer (38) which is mixed with non-magnetic material with high thermal conductivity such as copper, aluminium; and fiber reinforced resin layers (39), (39) which are respectively arranged inside and outside the high thermally-conductive resin layer (38) and which are made of non-conductive material such as glass fiber. At set positions of the fiber reinforced resin layer (39) at the outer peripheral side of the upper part of the bobbin (34), three annular grooves (40), (40), (40) are respectively formed so as to extend in parallel to each other in the circumferential direction of the bobbin (34). A loop of the pick-up coil (33) is wound around the annular groove (40). (41) indicates a female screw hole for attachment formed on an inner surface of the lower part of the bobbin (34).

In this example, the high thermally-conductive resin layer (38) is interposed, in the middle of the bobbin (34) in a thickness direction thereof, between the inside and outside fiber reinforced resin layers (39), (39), and the high thermally-conductive resin layer (38) includes non-magnetic material with high thermal conductivity. Accordingly, thermal-conduction characteristic of the bobbin (34) is enhanced with respect to the axial direction of the bobbin (34), thereby cooling the bobbin (34) and the pick-up coil (33) wound around it to the transition temperature of superconductivity at a short time by the cold receiving member (19) of the refrigerator (A). Further, it can be securely prevented that current loops generate at the bobbin (34) in the circumferential direction thereof, thereby further effectively preventing variation of the input/output characteristic of the SQUID magnetometer (B).

Figure 8:
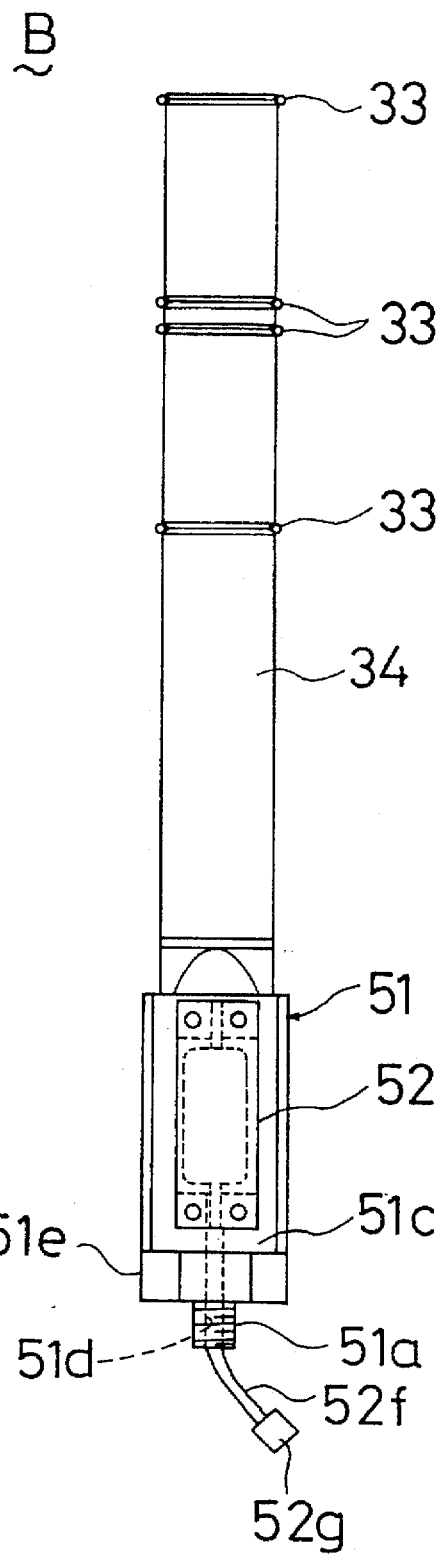
FIG. 8 is an elevation showing a magnetometer unit in an example 6 of this invention.
Figure 9:
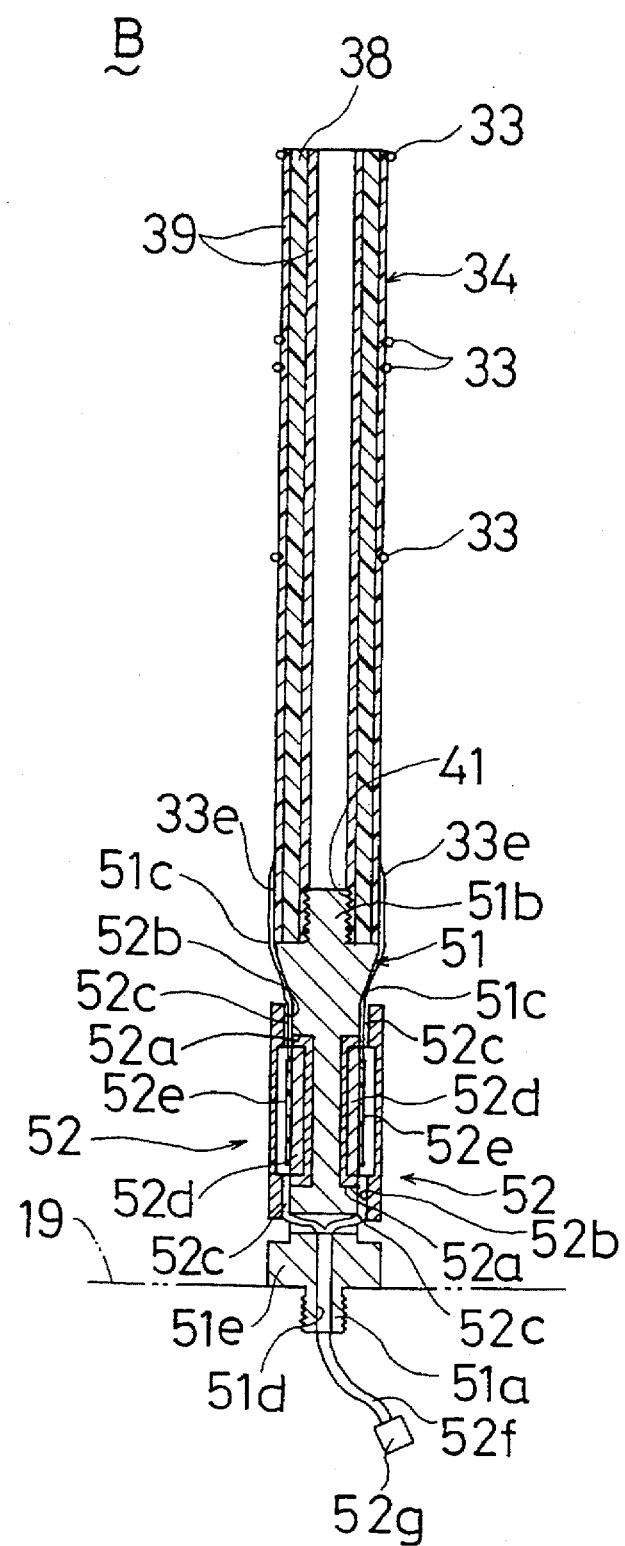
FIG. 9 is a longitudinal section cut in the middle of the magnetometer unit of the example 6.

FIGS. 8 to 13 show an example 8 of this invention. In detail, FIG. 8 is an elevation of a SQUID magnetometer of the example 6 and FIG. 9 is a longitudinal section cut in the middle of the SQUID magnetometer. (51) indicates a high thermally-conductive member having at its both ends male screw parts (51a), (51b), respectively. At set positions of the side of the middle of the high thermally-conductive member (51), a pair of concavities (51c), (51c) are formed. To each of the concavities (51c), there is attached a removable superconducting shield member (52) for containing the SQUID. The upper male screw part (51b) is engaged and fastened to a female screw part (41) located at the lower end of the bobbin (34) around which a pair of pick-up coils (33), (33) are wound.

The high thermally-conductive member (51) is made of such as copper and has a wire insert hole (51d) which is penetrated so as to open at the center of the end surface of the lower male screw part (51a) and at respective set positions of the concavities (51c).

The superconducting shield member (52) is composed of a base member (52a) attached so as to be embedded in the concavity (51c) of the high thermally-conductive member (51) and a cover member (52b) attached removably by a screw or the like. Grooves (52c) for inserting lead wires are formed at set positions of the cover member (52b). To each of set positions of the base member (52a), a substrate (52e) on which a SQUID (no-shown) is mounted is attached through a spacer member (52d). A large-diameter flange part (51e) is integrally formed at an upper side of the lower male screw part (51a), thereby increasing a contact area between the high thermally-conductive member (51) and the cold receiving member (19). The bobbin (34) is the same as in the example 5.

Each of the pick-up coils (33) is wound around the outer periphery of the bobbin (34), for example, so as to be a first-order differential type. Loops of the pick-up coils (33) are wound so as to be set in respective annular grooves (40), (40), . . . formed at set positions of the bobbin (34). As shown in FIGS. 8 and 9, the pair of pick-up coils (33), (33) are wound around the bobbin (34), and the pair of substrates (52e), (52e) respectively corresponding to the pick-up coils (33), (33) are contained in the superconducting shield members (52), (52), respectively. According to this construction, there is obtained a magnetometer unit (B) in which two SQUID magnetometers are integrated. In addition, a lead wire (33e) of the pick-up coil (33) passes one of the grooves (52c) and is connected to the SQUID of the substrate (52e), while a lead wire (52f) from the SQUID passes through the wire insert hole (51d) and is led out it. A connecter (52g) is provided at an end of the lead wire (52f).

Figure 10:
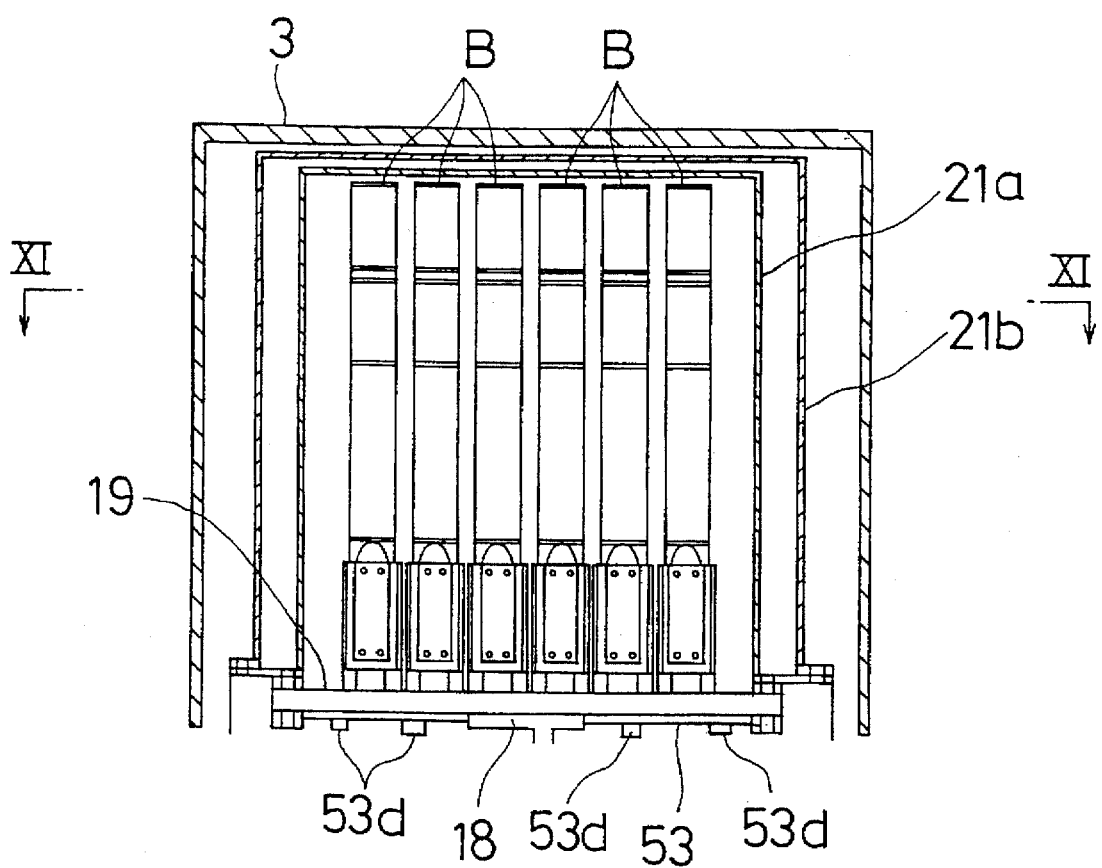
FIG. 10 is a longitudinal section cut in the middle schematically showing a structure of multi-channelized measuring system in which the thirty-two magnetometer units of the example 6 are disposed.
Figure 11:
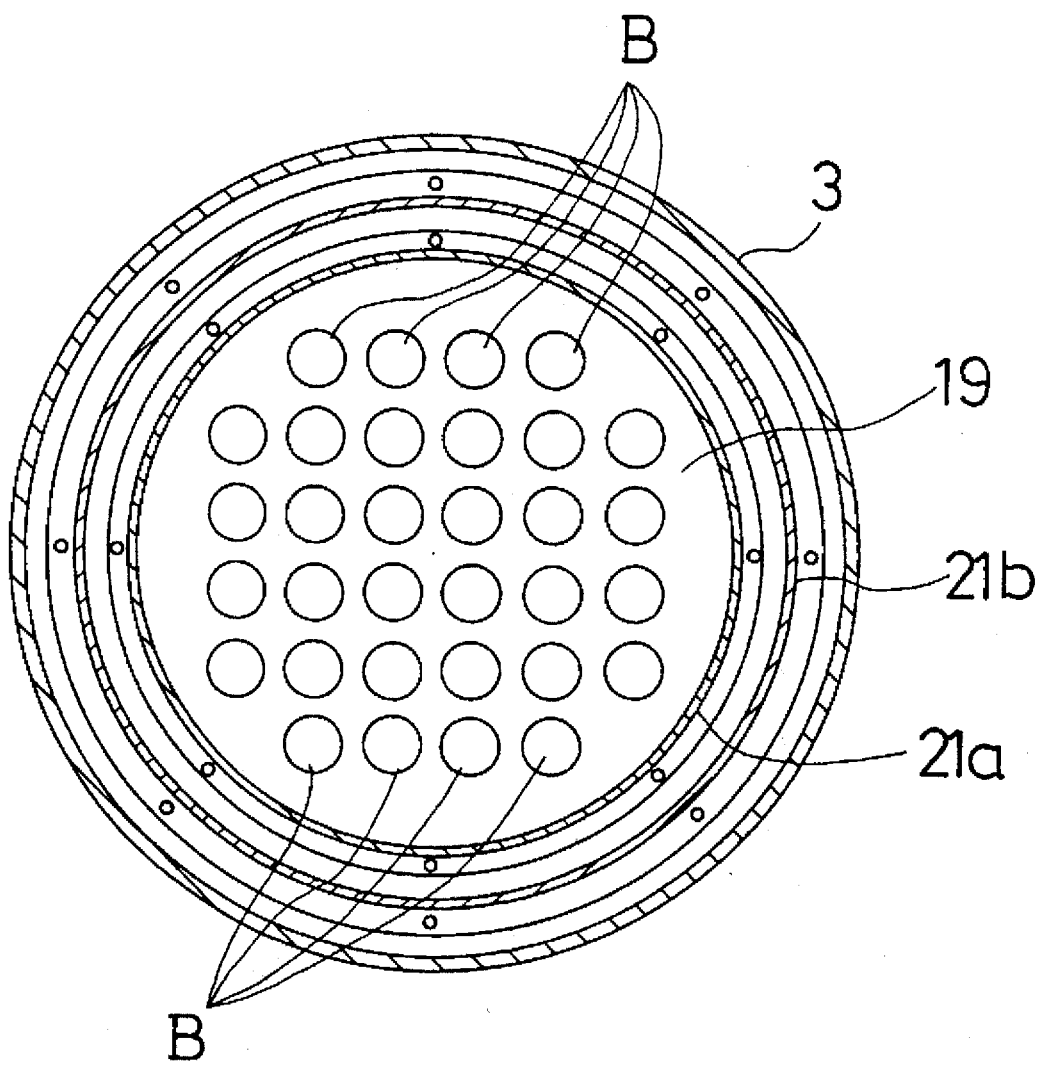
FIG. 11 is a section taken on line XI—XI of FIG. 10.

FIG. 10 is a longitudinal section cut in the middle schematically showing the construction of a multi-channelized measuring system in which thirty-two magnetometer units shown in FIG. 9 are arranged. FIG. 11 is a section taken on line XI—XI of FIG. 10. In these figures, the thirty-two magnetometer units (B), (B), . . . are arranged with set spaces left respectively in such a manner as to be screwed into the cold receiving member (19). The cold receiving member (19) is cooled up to below the transition temperature of superconductivity (for example, to about 4 K) by the no-shown cryogenic refrigerator. (21a) and (21b) indicate radiant heat shield members.

Figure 12:
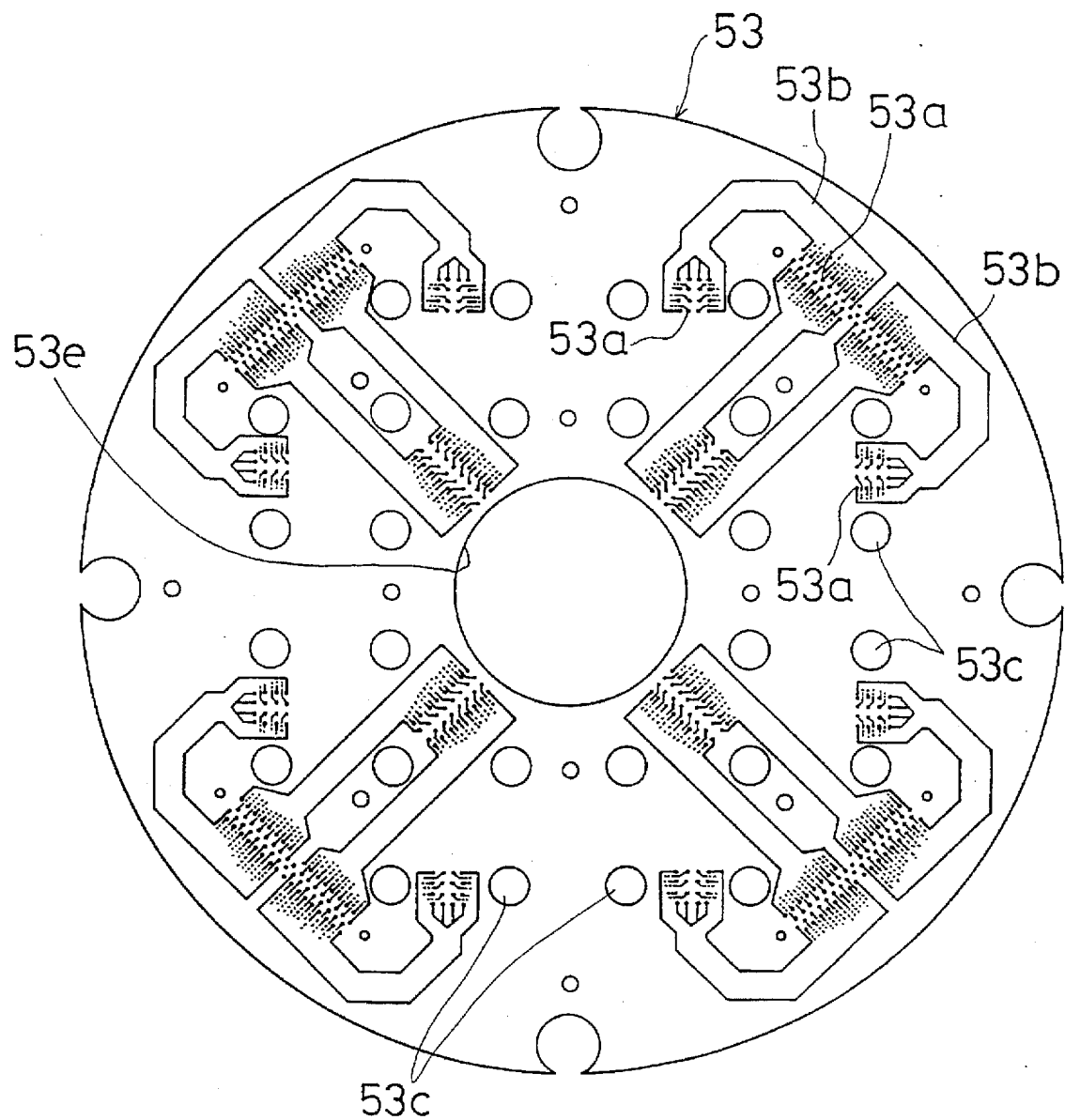
FIG. 12 is a plan view of a printed wiring substrate in the example 6.

At the bottom surface of the cold receiving member (19), there is disposed a printed wiring board (53) in which connecters (53d) are previously attached. As shown in FIG. 12, at the top surface of the printed wiring board (53), pins (53a) of the connecters (53d) are exposed and a wiring pattern for electrically connecting between corresponding pins (53a), . . . is formed. At set positions on the top surface of the printed wiring board (53), there are respectively formed through holes (53c) for respectively passing through the male screw parts (51a) of the magnetometer units (B). At the center of the top surface of the printed wiring board (53), there is formed a large-diameter hole (53e) for allowing a direct contact between the cold receiving member (19) and the cooler (18) as a final cooling part of the cryogenic refrigerator.

Figure 13:
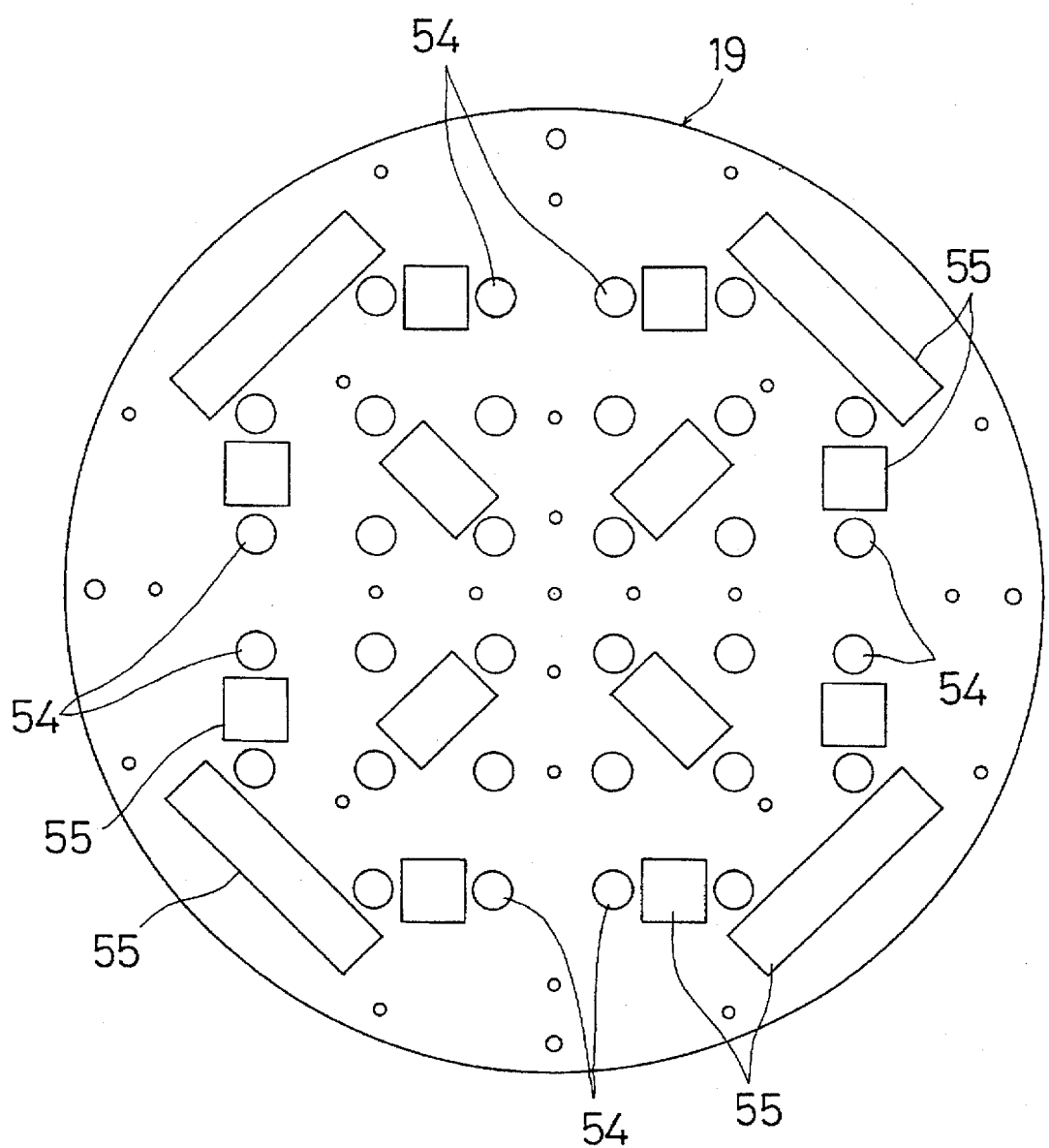
FIG. 13 is a bottom view of a cold receiving member in the example 6.

FIG. 13 shows a bottom surface of the cold receiving member (19). On the bottom surface of the cold receiving member (19), female screw holes (54) for respectively engaging with the lower male screw part (53c) of the high thermally-conductive member (51) are formed at corresponding positions to the through holes (53c), and concavities (55) for respectively containing the pin (53a) are formed at corresponding positions to the connecters (53d).

Description is made next about a method of assembling the SQUID magnetometer unit (B) having the above construction and a method of attaching the SQUID magnetometer unit (B) to the cold receiving member (19). First, the high thermally-conductive member (51) is integrally connected to the bobbin (34). The base members (52a) of the superconducting shield member (52) are attached to the concavities (51c) on the side of the high thermally-conductive member (51), respectively. Then, the substrate (52e) on which the SQUID is mounted is attached to the base member (52a) through the spacer member (52d).

Next, the pick-up coil (33) is wound around the bobbin (34). The lead wire (33e) of the pick-up coil (33) is connected at a set position of the substrate (52e) so as to be electrically connected to the SQUID. The lead wire (52f) for supplying a bias power source to the SQUIDs and for leading out electric signals from the SQUID is drawn out from the center of the end surface of the male screw part (51a) through the wire insert hole (51d). The connecter (52g) is connected to a free end of the lead wire (52f).

Finally, each of the cover members (52b) of the superconducting shield members (52) is fixed to the high thermally-conductive member (51) by a screw or the like and the lead wires (33e), (52f) are set in the grooves (52c) of the cover members (52b).

By carrying out the above process, there is obtained a magnetometer unit (B) in which two SQUID magnetometers are integrated.

Further, the printed wiring board (53) is disposed at the back (bottom surface) of the cold receiving member (19), and the cold receiving member (19) and the printed wiring board (53) are positioned and fixed in such a manner that the cooler (18) of the cryogenic refrigerator directly contacts the center of the bottom surface of the cold receiving member (19). At this time, the wiring of the printed wiring board also serves as a thermal anchor. Under this construction, since respective pins (53a) of the connecters (53d) are set in the concavities (55) of the cold receiving member (19), the pins do not short-circuit to one another.

Then, the radiant heat shield members (21a), (21b) and the vacuum chamber (3) are attached. Requisite wiring to the printed wiring board (53) is also conducted. In general, the above processes are previously conducted. Accordingly, when the magnetometer unit (B) is attached to the cold receiving member (19), the vacuum chamber (3) and the radiant heat shield members (21a), (21b) are removed so that the cold receiving member (19) is exposed to the outside. In such a condition, the magnetometer units (B) are attached to the cold receiving member (19) in such a manner that the male screw part (51a) is screwed into the female screw hole (54).

At this time, an attachment work of each magnetometer unit (B) is only a screwing and the superconducting shield member (52) is attached to the concavity (51c) of the high thermally-conductive member (51). This minimizes the space between the adjacent magnetometer units (B), (B).

Further, when each of the magnetometer units is attached to the cold receiving member (19), the lead wire (52f) in which the connecter (52g) is attached to the free end thereof hangs downward from the printed wiring board (53). Accordingly, if merely the connecter (52g) is connected to the corresponding connecter (53g) of the printed wiring board (53), requisite wiring can be readily accomplished.

Then, after all the magnetometer units (B), (B), ... are arranged and its wirings are conducted, the radiant heat shield member (21a), (21b) are attached and then the vacuum chamber (3) is attached. Next, the inner space of the vacuum chamber (3) is made vacuous and the cryogenic refrigerator is operated to cool all the SQUID magnetometers below the transition temperature of superconductivity. In this condition, a biomagnetic field is measured by the SQUID magnetometers.

Each of the magnetometer units (B) has two SQUID magnetometers. Accordingly, when the magnetometers are used for signal detection and for reference respectively in the above measuring, noise component resulting from, for example, the cryogenic refrigerator is removed thereby obtaining magnetic field measuring signals with high precision.

Furthermore, when each SQUID magnetometer has a pick-up coil (33) of first-order differential type, a set factor is multiplied to an output of one of the SQUID magnetometers and the multiplied value is subtracted from an output of another SQUID magnetometer, thereby obtaining a measuring signal equivalent to a SQUID magnetometer having a pick-up coil of second-order differential type which is well-balanced at 100%.

Moreover, since a first order gradient and a second order gradient of a magnetic field at the same axis are obtained by a single magnetometer unit (B), obtained information increases. This enhances precision of analyzing a magnetic field source and the like.

When something is wrong with any of the SQUID magnetometers, only a corresponding magnetometer unit (B) is removed and then examination and repair are conducted to it, that is, it is not required to remove another magnetometer units (B). This extremely simplifies the examination and repair.

In the example 6, there can be omitted concavities (51c) to be formed at set positions of the side of the high thermally-conductive member (51d), and in addition, there can be omitted wire insert holes (51d). Further, many kinds of design variations are applicable within the range in which the subject matter of this invention is not changed.

Furthermore, it is a matter of course that the present invention is applicable to a magnetic sensor composed of a SQUID magnetometer other than that for measuring magnetic waves from a human heart.

INDUSTRIAL APPLICABILITY

According to a magnetic sensor of this invention and a magnetic detecting device of this invention in which the magnetic sensor is combined with a cryogenic refrigerator, a SQUID which operates on a level of cryogenic temperature and a pick-up coil wound around a bobbin can be cooled below a transition temperature of superconductivity by the cryogenic refrigerator, without using liquid helium which requires much skill in operation. In this case, cooling from a cooling stage is smoothly conducted to the bobbin, thereby readily cooling the bobbin. This allows the pick-up coil to be cooled below the transition temperature of superconductivity at a short time. Accordingly, there can be accomplished a magnetic sensor and a magnetic detecting device for detecting with high sensitivity a faint magnetic field as in the case of measuring a biomagnetic field such as a magnetocardiogram. Thus, industrial applicability of this invention is extremely high.

I claim:

1. A magnetic sensor comprising:

a SQUID which is in the superconducting state on a level of cryogenic temperature;

a tubular resinous bobbin (34) having plural wires (35), each coated with a resinous film and made of non-magnetic material with high thermal conductivity, the plural wires (35) being embedded in the body of the resinous bobbin (34) and netted in a grid pattern so as to extend substantially in an axial direction of the bobbin (34) and a circumferential direction of the bobbin (34); and a magnetic-flux input circuit (32) which is connected to the SQUID and has a pick-up coil (33) wound around the tubular resinous bobbin (34).

2. The magnetic sensor according to claim 1,
wherein the wires (35) extending substantially in the axial direction of the bobbin (34) are larger in diameter than the wires (35) extending substantially in the circumferential direction of the bobbin (34).

3. A magnetic sensor comprising:

a SQUID which is in the superconducting state on a level of cryogenic temperature;

a tubular resinous bobbin (34) having plural wires (35), each coated with a resinous film and made of non-magnetic material with high thermal conductivity and having plural wires (36), each made of non-conductive material such as glass fiber, both of the plural wires (35), (36) being embedded in the body of the resinous bobbin (34) and netted in a grid pattern in such a manner that the wires (35) made of non-magnetic material with high thermal conductivity extend substantially in an axial direction of the bobbin (34); and a magnetic-flux input circuit (32) which is connected to the SQUID and has a pick-up coil (33) wound around the tubular resinous bobbin (34).

4. A magnetic sensor comprising:

a SQUID which is in the superconducting state on a level of cryogenic temperature;

a tubular bobbin (34) having a resinous body (37) and plural wires (35), which are made of non-magnetic material with high thermal conductivity and which are embedded in the resinous body (37) with set spaces left respectively in a circumferential direction of the bobbin (34) so as to extend substantially in an axial direction of the bobbin (34); and a magnetic-flux input circuit (32) which is connected to the SQUID and has a pick-up coil (33) wound around the tubular resinous bobbin (34).

5. A magnetic sensor comprising:

a SQUID which is in the superconducting state on a level of cryogenic temperature;

a tubular bobbin (34) having a wall part (34a) made of three layers formed of a high thermally-conductive resin layer (38) which is so formed that resin is mixed with non-magnetic material with high thermal conductivity, and two fiber reinforced resin layers (39), (39) which are respectively embedded inside and outside the high thermally-conductive resin layer (38) and each includes non-conductive material such as glass fiber; and a magnetic-flux input circuit (32) which is connected to the SQUID and has a pick-up coil (33) which is connected to the SQUID and has a pick-up coil (33) wound around the tubular resinous bobbin (34).

6. A magnetic sensor according to claim 1, 2, 3, 4 or 5 comprising:

a cryogenic refrigerator (A) for cooling a cold receiving member (19) to a level of cryogenic temperature, wherein the resinous bobbin (34) of the magnetic sensor is connected to the cold receiving member (19) so as to be thermally conductive.

7. The magnetic detecting device according to claim 6, wherein the magnetic sensor comprises:

a high thermally-conductive member (51) an end of which is connected to the bobbin (34) and another end of which is removably attached to a set position of the cold receiving member (19); and a superconducting shield member (52) which is removably attached to a set position of the side of the high thermally-conductive member (51) and contains the SQUID at the attached state thereof.

8. The magnetic detecting device according to claim 7, wherein a concavity (51c) is formed at a set position of the side of the high thermally-conductive member (51), and the superconducting shield member (52) is attached to the concavity (51c).

9. The magnetic detecting device according to claim 7, wherein the high thermally-conductive member (51) has, at an end thereof which is removably attached to the set position of the cold receiving member (19), a through hole (51d) for being inserted by a wire (52f) toward a room temperature's side.

* * * * *